United States Patent
Griesmer et al.

(10) Patent No.: US 6,876,594 B2
(45) Date of Patent: Apr. 5, 2005

(54) INTEGRATED CIRCUIT WITH PROGRAMMABLE FUSE ARRAY

(75) Inventors: Roger C. Griesmer, Murphy, TX (US); Robert L. Pitts, Dallas, TX (US); Bryan D. Sheffield, Rowlett, TX (US); Kun-His Li, Plano, TX (US); Mark J. Jensen, Allen, TX (US); Vinod J. Menezes, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/739,520

(22) Filed: Dec. 19, 2003

(65) Prior Publication Data

US 2004/0129952 A1 Jul. 8, 2004

Related U.S. Application Data

(60) Provisional application No. 60/436,596, filed on Dec. 26, 2002.

(51) Int. Cl.$^7$ .................................................. G11C 7/00
(52) U.S. Cl. ...................... 365/225.7; 365/200; 365/96
(58) Field of Search .............................. 365/225.7, 200, 365/96, 100

(56) References Cited

U.S. PATENT DOCUMENTS

| | | | | | |
|---|---|---|---|---|---|
| 4,577,294 A | * | 3/1986 | Brown et al. | ................ | 365/200 |
| 4,872,140 A | * | 10/1989 | Graham et al. | ................ | 365/96 |
| 6,094,386 A | * | 7/2000 | Kohyama | ................... | 365/200 |
| 6,577,156 B2 | * | 6/2003 | Anand et al. | ............ | 365/225.7 |

* cited by examiner

*Primary Examiner*—Huan Hoang
(74) *Attorney, Agent, or Firm*—Alan K. Stewart; W. James Brady, III; Frederick J. Telecky, Jr.

(57) ABSTRACT

An integrated circuit (IC). The integrated circuit comprises an array (14) of data cells arranged in a plurality of rows and a plurality of columns. Each of the data cells comprises an electrically programmable fuse (40), and each electrically programmable fuse comprises a current path for providing a first digital state when the current path is left intact and for providing a second digital state when the current path is destroyed. Each row of the plurality of rows comprises at least one cell reserved for providing a protection indicator for the row, wherein the protection indicator is selected from a set consisting of read protection and write protection. The integrated circuit also comprises control circuitry (12) for selectively destroying the programmable fuse in selected ones of the data cells in a programmation mode. The integrated circuit also comprises control circuitry (12) for reading selected ones of the data cells in a read mode.

61 Claims, 3 Drawing Sheets

INTEGRATED CIRCUIT WITH PROGRAMMABLE FUSE ARRAY

CROSS-REFERENCES TO RELATED APPLICATIONS

This application claims priority, under 35 U.S.C. §119(e)(1), of U.S. Provisional Application No. 60/436,596, filed Dec. 26, 2002, and incorporated herein by this reference.

STATEMENT REGARDING FEDERALLY SPONSORED RESEARCH OR DEVELOPMENT

Not Applicable.

BACKGROUND OF THE INVENTION

The present embodiments relate to programmable electrical fuses for use in integrated circuits and are more particularly directed to integrated circuits that include an array configuration of such fuses.

Programmable fuses exist in the art in at least two forms, a first known as a laser fuse and a second known as an electrical fuse. For both types, each fuse is either left intact to provide a first logical state or is "programmed" so that the fuse is opened, effectively by destroying a portion of the fuse structure so that its conductivity path is opened, to provide a second logical state which is complementary of the first logical state. In the case of a laser fuse, a laser is used to open each selected fuse by physically imparting the laser energy to the fuse, thereby destroying the continuity of the fuse and providing an open circuit across it. In the case of an electrical fuse, a relatively large amount of current is flowed through the fuse, thereby destroying the continuity of the fuse and providing an open circuit across it. Another type of electrical fuse is referred to in the art as an anti-fuse, where an affirmative action is taken to restore connectivity through the fuse to obtain a first data state, or this act is not taken with respect to the fuse in order to provide a second and complementary data state. In either event, such fuses and the states they provide have been used for various applications. For example, these programmable fuses may be used for memory redundancy control, integrated circuit die identification, analog trimming control, customer configuration bits, encryption key coding, as well as other applications.

Also in the prior art, both laser and electrical fuses are located in distributed locations across an integrated circuit die. For example, U.S. Pat. No. 6,292,422, entitled "Read/Write Protected Electrical Fuse," issued Sep. 18, 2001, assigned to Texas Instruments Incorporated, and hereby incorporated herein by reference, illustrates such an approach. In some implementations of this nature, typically each fuse is proximate other circuitry that requires the digital value provided by the corresponding fuse. Moreover, typically a storage device is associated with each such fuse and, thus, these storage devices are also distributed at different locations across the integrated circuit. Further, to evaluate if the fuses are properly programmed, the distributed storage devices can be read from the device as a scan chain. Often during the manufacturing process, only selected ones of the fuses are opened according to a technique as described above, thereby causing them to provide one logic state while the unaffected fuses provides another and complementary logic state. To accomplish the programming of selected fuses, therefore, the efforts to selectively destroy only those selected fuses also must be made at locations distributed across the die. Moreover, with respect to electrical fuses, there is required that additional fuse blowing circuitry, including what is sometimes referred to as a zap transistor in connection with each separate fuse, also must be distributed across the die. Also with respect to electrical fuses, there is required that a corresponding circuit for reading each fuse, such as a sense amplifier or comparable circuitry for comparing the fuse voltage with a reference voltage, must be distributed across the die for each respective fuse.

While the current state of the art has provided various useful implementations, the present inventors have observed that while the prior art has improved upon previous systems, there remains still additional improvements as provided with respect to various issues in the preferred embodiment. For example, various considerations arise from the distributed nature of the prior art approach. Such considerations include increased complexity when circuit design changes are made, a lack of scalability, and increased complexity and signal drive requirements in sufficiently routing power to fuses for programming and for reading an entire scan chain at a time to determine if the fuses have been correctly programmed. Other issues exist in that certain additional aspects are not provided or cannot be provided as compared to the preferred embodiments. Accordingly, there arises a need to address the drawbacks of the prior art and to provide still additional functionality and benefits as compared to prior art programmable fuses architectures, where such aspects will be further appreciated from the remaining teachings of this document.

BRIEF SUMMARY OF THE INVENTION

In one preferred embodiment, there is an integrated circuit. The integrated circuit comprises an array of data cells arranged in a plurality of rows and a plurality of columns. Each of the data cells comprises an electrically programmable fuse, and each electrically programmable fuse comprises a current path for providing a first digital state when the current path is left intact and for providing a second digital state when the current path is destroyed. Each row of the plurality of rows comprises at least one cell reserved for providing a protection indicator for the row, wherein the protection indicator is selected from a set consisting of read protection and write protection. The integrated circuit also comprises control circuitry for selectively destroying the programmable fuse in selected ones of the data cells in a programmation mode. The integrated circuit also comprises control circuitry for reading selected ones of the data cells in a read mode.

Numerous other aspects are also disclosed and claimed.

DETAILED DESCRIPTION OF THE INVENTION

Figures 1, 6:
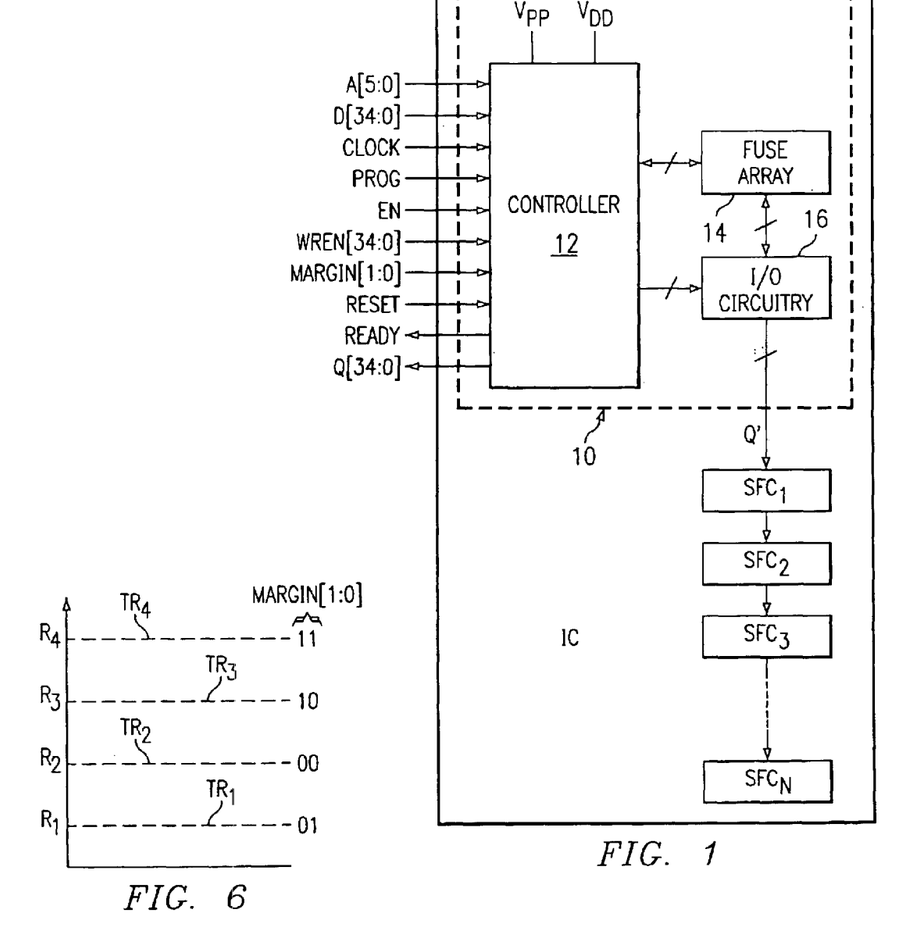
FIG. 1 illustrates an electrical block diagram of an integrated circuit IC that includes a programmable fuse block 10 according to the preferred embodiment.
FIG. 6 illustrates a plot of the four thresholds corresponding to enabling each of n-channel transistors $T_0$, $T_1$, $T_2$, and $T_3$ of FIG. 5.

FIG. 1 illustrates an electrical block diagram of an integrated circuit IC that includes a programmable fuse block 10 according to the preferred embodiment. Integrated circuit IC may be any of various kinds of integrated circuits known in the art and also operable to provide a variety of differential functionalities. By way of simplification, FIG. 1 illustrates integrated circuit IC as a die, and one skilled in the art will readily appreciate that the die is later fixed relative to an integrated circuit package using known techniques, including the creation of additional connections and bonding to appropriate bond pads for signal input/output, where certain considerations of bonding are further discussed herein. In any event, integrated circuit IC is of the type that benefits from the use of fixed data states, where those states are implemented by programming a set of programmable fuses.

Programmable fuse block 10 includes a controller 12 which receives various input signals described below. In response to these input signals, controller 12 is bi-directionally connected to a fuse array 14, and controller 12 is also connected to input/output ("I/O") circuitry 16. As detailed later, fuse array 14 includes a number of electrically programmable fuses positioned in an array format, where each such fuse is formed of a material/structure such that the fuse provides a current path that results in a first digital state when the current path (i.e., the fuse) is left intact and that results in a second digital state when the current path is destroyed. Further, fuse array 14 is bi-directionally connected to I/O circuitry 16. Lastly, I/O circuitry 16 is operable to serialize a group of 32 bits read at a time from array 14 and to output the serial stream as data Q', where that serialized data Q' is also included in a 35-bit parallel format, Q[34:0], which is provided by controller 12 and which includes the 32 bits of Q', yet it further includes three additional bits discussed later. The bits of Q' are connected via a bus B to a scan chain that includes a number of storage and functional circuits. By way of example, such storage and functional circuits are shown in FIG. 1 as serially connected in a chain and designated $SFC_1$, $SFC_2$, and so forth through $SFC_N$. Generally, each circuit $SFC_x$ represents the ability to store a data state corresponding to a data state indicated by a fuse in fuse array 14, and each circuit $SFC_x$ further represents a corresponding functional circuit that operates in response to such a data state. Thus, fuse array data is output using I/O circuitry 16 and is scanned into the scan chain consisting of the storage portion of circuits $SFC_x$, and thereafter each functional portion of each such circuit $SFC_x$ may operate with respect to the stored data. The functional circuitry using the data encoded by each corresponding fuse may be of various forms, such as random access memories, customer identification codes, integrated circuit die identification numbers, analog trim values, configuration bits, encryption key coding, and so forth. Further, one skilled in the art will appreciate that the data state from multiple storage and functional circuits may be combined in to provide a data value to a circuit that requires a multiple bit input data value. Lastly, while FIG. 1 illustrates only a single fuse array and a single scan chain of the storage portion of circuits $SFC_x$, alternative embodiments may include multiple fuse arrays and/or multiple scan chains, and indeed, in the case of multiple scan chains data may be read out of an array(s) to different chains at the same time, thereby increasing overall data rate.

Turning to the operation and signals in connection with controller 12, first note that in the preferred embodiment, controller 12 includes a state machine and supporting circuitry, where various implementation details may be selected by one skilled in the art given the functional descriptions set forth in this document. Next, looking to the input signals to controller 12, note that in different embodiments only selected ones of these inputs are connected to respective external pins so that the corresponding signal can be provided after integrated circuit IC is packaged. Thus, for those signal inputs that are not connected to external pins, signals instead may be provided to program programmable fuse block 10 prior to packaging the integrated circuit die into a complete manufactured device. In either event, the signals input to and output from controller 12 are as follows.

A 6-bit address signal A[5:0] is provided to address cells in fuse array 14 for purposes of either writing data to, or reading data from the addressed cells in fuse array 14. Further in this regard and as detailed below, fuse array 14 is configured to include a number of rows, where each row includes a number of storage cells and each such storage cell includes a single programmable fuse; thus, in the sense of having an array-like structure, fuse array 14 is akin to a programmable memory with rows and columns of storage cells. In the preferred embodiment, the number of rows equals 64 and the number of columns equals 32. Thus, the 6-bit address signal A[5:0] is for presenting, at one time, an address of any one of the 64 rows. Clearly, however, in alternative embodiments a different number of rows and/or columns and/or addressing bits may be implemented and, indeed, additional bits and control may be included to address less than all cells in one row at a time.

A 35-bit data signal D[34:0] is also connected to controller 12 for writing data into fuse array 14, preferably corresponding to data for a single row of cells in fuse array 14. In the preferred embodiment and for the majority of the rows in fuse array 14, 32 of these 35 bits represent raw data, where such bits are indicated for sake of reference in this document as D[31:0]. The remaining three of the 35 bits are to provide write protection, read protection, and parity, for the row corresponding to the address provided by A[5:0]. These three remaining bits are shown herein as D[34:32], where the functionality of write protection, read protection, and parity are further detailed later.

A clock signal CLK is also connected to controller 12. The clock signal CLK synchronizes operations within controller 12 as well as the input of data to, and output of data from, programmable fuse block 10.

A program signal PROG is also connected to controller 12. In the preferred embodiment, the program signal PROG is asserted active high (and is asynchronous) to enable the writing (i.e., "programming") of data to fuse array 14. More particularly and as detailed below, PROG is asserted to enable a programmation mode of operation of programmable fuse block 10, wherein each fuse within each corresponding cell of fuse array 14 may be programmed to one of two data states; later, therefore, in a read mode of operation of programmable fuse block 10, the previously-programmed data state for each fuse may be read. Looking more particularly to the programmation mode, the program signal PROG is asserted active high. Also during that time, a row of fuse cells in fuse array 14 are addressed with A[5:0], and the data states to be written to that row, in the form of either a logical 1 or a logical 0, are input via the 35-bit wide data bus D[35:0]. When programming is complete or not desired, PROG is de-asserted low. Lastly, note that the program signal PROG is preferably gated by the clock signal CLK going to a low state (i.e., upon the low transition of CLK, the PROG signal is connected to circuitry within controller 12).

An enable signal EN is also connected to controller 12. In the preferred embodiment, the enable signal EN is active high and synchronous. Further, the enable signal EN is asserted to enable two different operations, namely: (i) reading of data from fuse array 14 in the read mode by enabling sense amplifiers in I/O circuitry 16, discussed later; and (ii) programming of data during the programmation mode to more specifically enable a driver for a voltage source, designated herein as $V_{PP}$. As detailed later, $V_{PP}$ is relatively large in comparison to the normal operating voltage of programmable fuse block 10, where that normal operating voltage is designated herein as $V_{DD}$. Further discussions of $V_{PP}$ and $V_{DD}$, as well as a preferred isolation between the two, are also provided later.

An active high write enable signal WREN[34:0] is also connected to controller 12. In the preferred embodiment, the write enable signal WREN[34:0] is a bit-by-bit enabling mask for writing data to the 35 cells in an addressed row of fuse array 14. In other words, the write enable signal WREN[34:0] used to gate data input during programming such that only each data bit D[34:0] having a respective enabled bit in WREN[34:0] is written to the addressed row in fuse array 14. Conversely, therefore, by setting one or more selected bits in the write enable signal WREN[34:0] to a low (i.e., active disabled) state, then the respective bit in the data D[34:0] will not be written to fuse array 14. For example, if during a write cycle bit WREN[6] is low, then the respective data on bit D[6] will not be written to the then-addressed row in fuse array 14.

A 2-bit signal indicated as MARGIN[1:0] is connected to controller 12. As detailed below, in the preferred embodiment, after programming, then in a read mode each row of fuses in fuse array 14 may be read. However, the present inventors have recognized that in previous fuse-based systems, such as those wherein fuses are distributed at various locations throughout an integrated circuit, the programming of such fuses, which attempts to destroy selected fuses so as to achieve a corresponding data state, is sometimes not fully successful. In other words, such fuses may be considered to be only partially-destroyed as evidenced by the result that the data sensing circuit associated with the fuse will provide an ambiguous output voltage, that is, a voltage indicating that the fuse might be intact or might not be fully destroyed. In the present preferred embodiment, however, the signal MARGIN[1:0] allows for the selection of four different levels of voltage (or corresponding resistance) for testing for each programmed fuse, that is, the state of the two bits in MARGIN[1:0] selects one of four different bases of comparison to the resistance of the tested fuse. By testing in this manner, each fuse may be evaluated to determine if programming has achieved a sufficient destruction of the fuse such that the fuse will later provide reliable data to its associated storage and functional circuit $SFC_x$. Accordingly, if a deficiently programmed fuse is detected, then additional measures may be taken, and such measures are also described later.

Finally, in the preferred embodiment controller 12 includes a joint test action group ("JTAG") interface that may include various signals including separate address and data input/output signals, although various of such signals are not separately illustrated because in general they provide the same functionality as may be achieved with above-discussed counterparts, where in some embodiments the JTAG interface may be the only connections provided to an external user once integrated circuit IC is packaged. However, in the preferred embodiment, the JTAG interface does include two additional signals, as are now described, and specifically which include a RESET signal connected to controller 12 and a related READY output signal provided from controller 12. Specifically, in the preferred embodiment, controller 12, in an autoload mode, will automatically attempt the read mode upon assertion of the RESET signal, provided fuse array 14 has been previously programmed, which may be confirmed by controller 12 examining a specified bit in row 0 of fuse array 14 as described below. In this manner, in one implementation of programmable fuse block 10, the programming mode of fuse block 10 may be performed during manufacturing, with the device then packaged and delivered to a customer. Then, the customer provides an asserted RESET signal, and when that signal is asserted, controller 12 operates to read the data states from fuse array 14 and shift them out into the chain consisting of circuits $SFC_1$, $SFC_2$, and so forth through $SFC_N$. As introduced above, in the preferred embodiment array 14 has a number of rows; thus, preferably in response to the assertion of RESET, each row is read by controller 12 one at a time, so that the data along the read row is output from fuse array 14, using I/O circuitry 16 and under the control of controller 12, to the scan chain of storage and functional circuits. When all of the data has been read in this manner from fuse array 14 into the scan chain, then controller 12 asserts the READY signal, thereby indicating completion of the read mode. From the preceding, therefore, note that a customer need only provide circuitry for asserting the RESET signal and then awaiting the READY signal, after which normal operations of the functional aspects of circuits $SF_1$ through $SF_N$ (and any other related circuitry) may commence.

Figure 2:
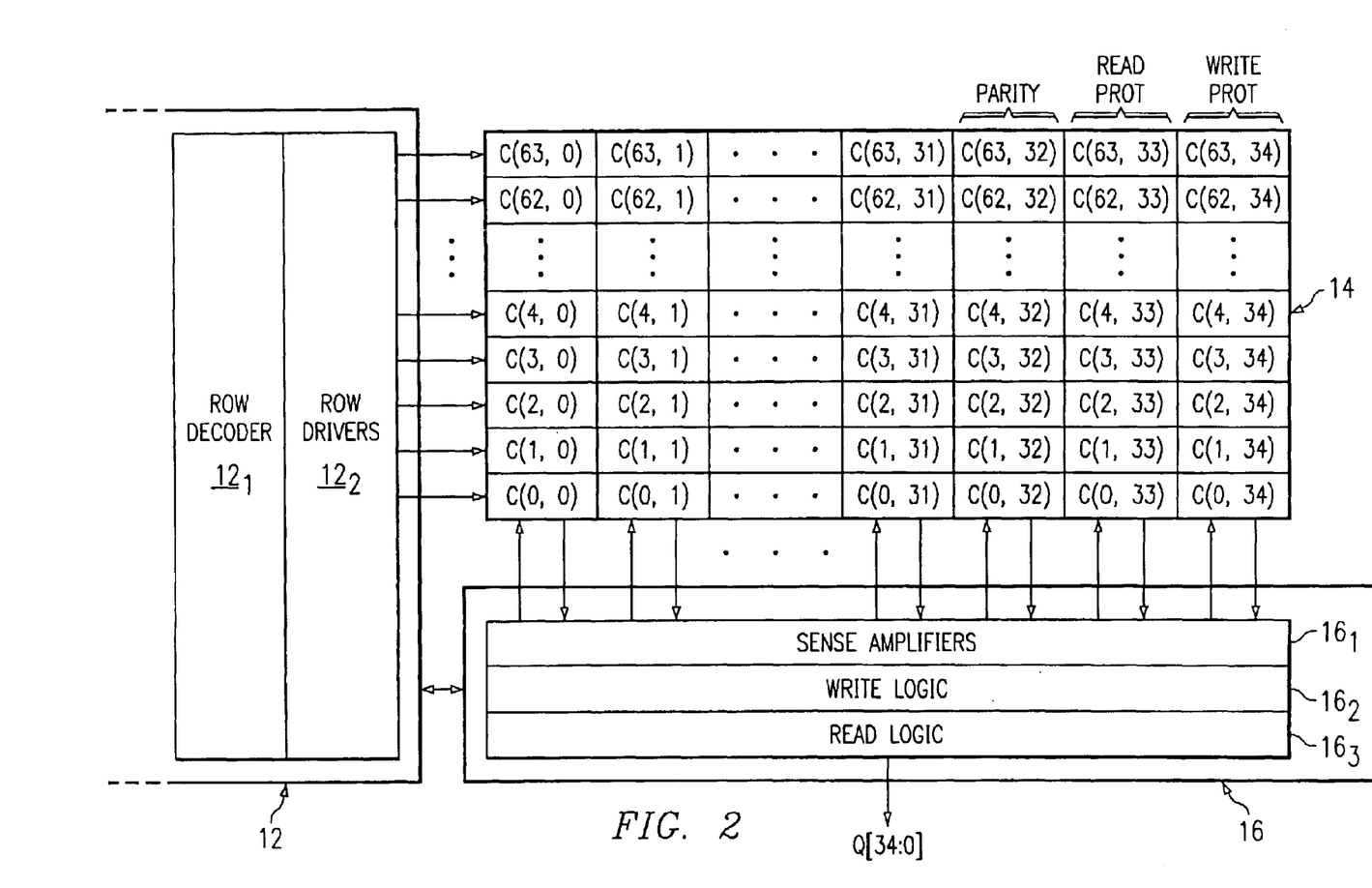
FIG. 2 illustrates an electrical block diagram of additional details for each of controller 12, fuse array 14, and I/O circuitry 16 of FIG. 1.

FIG. 2 illustrates an electrical block diagram of additional details for each of controller 12, fuse array 14, and I/O circuitry 16 of FIG. 1, as are now described. As mentioned above, in the preferred embodiment fuse array 14 includes 64 rows, each having 32 fuse cells, preferably arranged in columns as illustrated in greater detail in a partial view in FIG. 2. As detailed later, in the preferred embodiment, each fuse cell includes an electrically-programmable fuse, which may be programmed by imparting a current through the fuse so as to destroy, or "blow," the fuse so as to provide a first data state, or in contrast the fuse may be left intact, or "unblown," in which case it will provide a second data state complementary to the first data state. For sake of example, various fuse cells are shown in FIG. 2, with each cell having an identifier C(r,c), where r indicates the row and c indicates the column for which the cell is aligned in fuse array 14. Thus, along row 0 of fuse array 14 are cells C(0,0) through C(0,34), along row 1 of array 14 are cells C(1,0) through C(1,34), and so forth through row 63 of array 14, which includes cells C(63,0) through C(63,34). In the preferred embodiment, rows 1 through 63 are generally used for raw data. Further, preferably only cells 0 through 31 are used for raw data in these rows, while following the 32 raw data bits for each of rows 1 through 63 and in its columns 32, 33, and 34, respectively, are a parity bit, a read protection bit, and a write protection bit. Each of these bits, therefore, provides the stated function for the corresponding row. Thus, if the read protection bit is set in a row, then the raw data in columns 0 through 31 of that row cannot be read externally from integrated circuit IC; such a function is beneficial for various applications, such as protecting proprietary data, stored by the fuses, to be read by consumers or others once integrated circuit IC is packaged. Similarly, if the write protection bit is set in a row, then data cannot be written to the cells in columns 0 through 31 of that row; such a function is also beneficial for various applications, such as protecting critical data, stored by the fuses, from being overwritten once it has been written and verified. Still further, the parity bit may be programmed to provide parity data for the corresponding row, using one of various parity indications known in the art. Lastly, while not shown, note that an additional bit or bits may be added per row to provide still additional functionality; for example, error correction bits may be added, which may be particularly advantageous in a fuse environment given the permanent nature of the fuse state once it is programmed. Such error correction bits may be used to detect and correct errors in a certain number of bits in the row corresponding to the error correction bits.

Also in the preferred embodiment, row 0 is preferably used for various features. Specifically, bits 6:0 of row 0 (i.e., cells C(0,0) through (C0,6)) are used to indicate redundancy information, where bits 5:0 provide a row address and bit 6 provides a redundancy enable bit. Thus, if during testing or after programmation it is determined that one of the rows in fuse array 14 is defective such as if it provides erroneous data, then bit 6 enables redundancy and thereby indicates that one row in array 14 is reserved to provide redundant storage for a given row in the array (such as when the given row is detected to have a problematic fuse), and bits [5:0] also provide the address for that given row. Accordingly, when an address is provided to address a row within fuse array 14, then row 0 is first consulted, and if that address is directed to a row having a redundant row in array 14, then the redundant row, rather than the originally-addressed row, is accessed for the sake of reading/writing data. Further in this regard, while in one preferred embodiment only a single row of redundancy is provided, in alternative embodiments more than one row of redundancy is provided and, indeed, one or more columns of redundancy also may be provided. Returning to the preferred embodiment and with respect to row redundancy, row swapping is used to address the redundant row, that is, when the address arrives and is directed to the defective row, then the redundant row is instead accessed, while the remaining row addresses in the array remain unchanged; this is in contrast to row shifting which is sometimes implemented for redundancy in the random access memory art, where in that case the address for the working rows are all shifted so as to avoid the address of the defective row—this latter approach is unworkable in the preferred embodiments due to the permanent nature of the data once it is stored in the array. Note also that row 0 will also include the above-described write protection bit and, thus, once the redundancy information is written into row 0, that information can be further protected from being overwritten by setting the write protection bit for row 0. Two other bits in row 0 of fuse array 14 are reserved to indicate a global write protect and a global read protect, respectively, providing various forms of data protection and integrity. For example, if the global write protect bit is set in row 0, then the entire fuse array 14 cannot be written, such as may be desired once fuse array 14 has been programmed and tested. As another example, if the global read protect bit is set in row 0, then the entire fuse array 14 cannot be read externally once integrated circuit IC as a die is placed into an integrated circuit package, as may be desired to protect data therein from being discovered. Also in the preferred embodiment, the bits of cells C(0,28) and C(0,29) in row 0 are reserved to be programmed with a two-bit value indicating a compression algorithm corresponding to the data stored in other rows of array 14; further, one state of these two bits, such as a logical value of 00, indicates no compression is implemented. Also in the preferred embodiment, the bit of cell C(0,30) in row 0 is reserved to be programmed with a given state (e.g., active high) once the raw data has been programmed into rows 1 through 63 of array 14, thereby indicating completion of programming. Thus, this bit may be consulted by controller 12, when RESET is asserted, thereby indicating once data has been stored in fuse array 14 and thus is meaningfully ready for reading out to the storage and functional units $SFC_1$ through $SFC_N$. Still further in the preferred embodiment, the bit of cell C(0,31) is reserved to be programmed with a given state (e.g., active high) to indicate that column 32 for the remaining rows 1 through 63 provides a parity bit for each such row. Finally, an additional bit or bits is preferably reserved within row 0 of fuse array 14 to indicate an autoload clock speed and clock divider select. Particularly, in the preferred embodiment, controller 12 includes an internal oscillator that, when enabled, provides an automatic clock signal to controller 12 for the sake of various operations, including certain testing techniques such as described later as well as the autoload operation described above to include the automatic loading of data from fuse array 14 into storage and functional circuits $SFC_1$ through $SFC_N$.

Looking to the circuitry shown in FIG. 2 relating to controller 12, it is shown to include a row decoder $12_1$ and a set of row drivers $12_2$. Circuits that are comparable in some respects to row decoder $12_1$ and row drivers $12_2$ are known in the memory art, but here these circuits are modified to accommodate the structure of fuse array 14 and the cell schematic as detailed later. Generally, row decoder $12_1$ receives the input address signal A[5:0] shown in FIG. 1 and decodes that address so that the appropriate row in fuse array 14 is addressed; however, as mentioned above, row 0 of fuse array 14 also includes a redundancy address and, thus, each time integrated circuit IC is powered-up, such redundancy information is read into row decoder $12_1$ or circuitry associated with it so that it may further take that information into account should the address on address signal A[5:0] be directed to a row that is defective yet that has a redundant storage facility in fuse array 14. In any event, once row decoder $12_1$ identifies a single row in response to the address signal A[5:0] or in response to other signals, then row decoder $12_1$ enables the corresponding circuitry in drivers $12_2$ to drive sufficient signals to the cells in that row. The specific driving signals are based on the action sought to be taken, where such actions include either the writing of each cell (or a limited number of cells in response to the mask provided by WREN[34:0] as described above) on a row during programmation or the reading of each cell after programmation.

Looking to the circuitry shown in FIG. 2 relating to I/O circuitry 16, it is shown to include a set of sense amplifiers $16_1$, write logic $16_2$, and read logic $16_3$. In general, these circuits are comparable in some respects to those known in the memory art, but here these circuits are modified to accommodate the structure of fuse array 14 and the cell schematic as detailed later. With respect to sense amplifiers $16_1$, in the preferred embodiment a single sense amplifier is connected to each corresponding column of cells in fuse array 14. Thus, in the example provided having 35 columns, a total of 35 sense amplifiers are included in block $16_1$. Note by way of contrast in the current art for programmable fuses that are distributed in differing locations across an integrated circuit, each fuse has a sense amplifier associated with it, that is, for M such prior art fuses there are a total of M corresponding sense amplifiers. In contrast, therefore, the preferred embodiment provides a total number of fuses that may be represented as r times c, yet only c sense amplifiers are required to read the data represented by the fuses. This reduction provides various benefits over the prior art, such as decreasing various attributes including overall device size, complexity, power consumption, and cost. Write logic $16_2$ includes the additional circuitry beyond the drive signals provided by row drivers $12_2$ for sake of writing data to the cells across an entire addressed row of array 14, or less than all cells in that row as may be achieved using the above-described WREN[34:0] signal, where that signal may be used as a mask in connection with write logic $16_2$. Thus, the data provided by D[34:0] is connected to write logic $16_2$ which then appropriately couples it to the addressed row in fuse array 14. Read logic $16_3$ represents any additional couplings and/or circuitry that might be implemented to provide data sensed by sense amplifiers $16_1$ to the data output Q[34:0].

Figure 3:
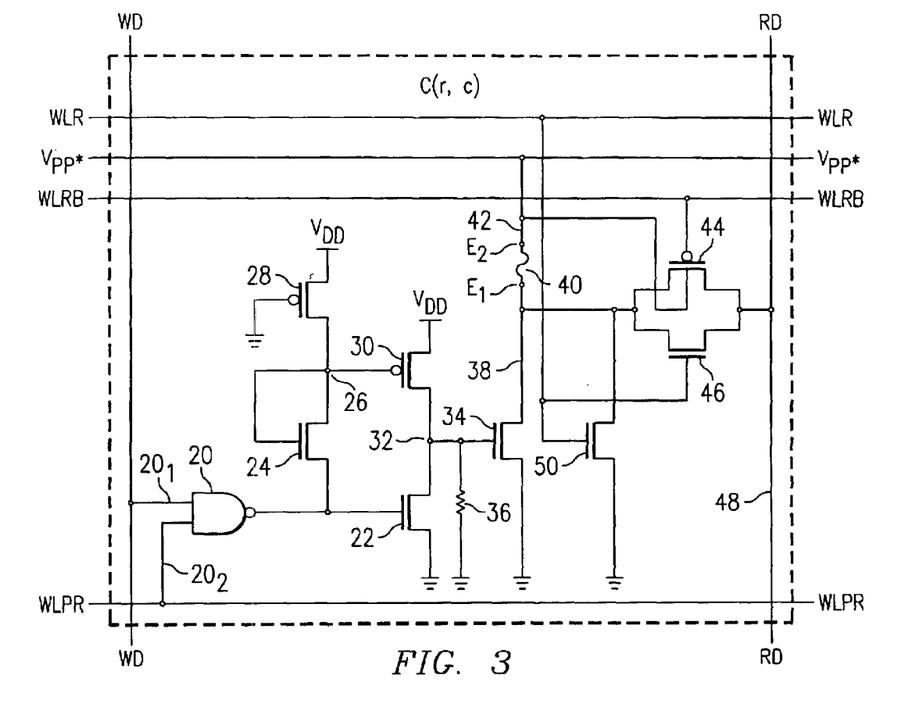
FIG. 3 illustrates a schematic of a preferred embodiment for implementing each of cells C(r,c) of fuse array 14 in FIG. 2.

FIG. 3 illustrates a schematic of a preferred embodiment for implementing each of cells C(r,c) of fuse array 14 in FIG. 2. Various signals are shown in connection with FIG. 3, where one skilled in the art will appreciate that such signals facilitate the writing (i.e., programming) of data into cell C(r,c) and the reading of data from that cell. However, the signal names differ from those input to controller 12 as shown in FIG. 1 since controller 12 is understood to receive the FIG. 1 signals and to provide corresponding control signals to each addressed cell according to the various aspects described in this document as well as the skill in the art, where some of these corresponding control signals are now shown and described below in connection with FIG. 3.

Looking to the circuitry in cell C(r,c), a NAND gate 20 has a first input $20_1$ connected to receive a write data signal WD and a second input $20_2$ connected to receive a word line program signal WLPR. The output of NAND gate 20 is connected to the gate of an n-channel transistor 22 and also to the source of an n-channel transistor 24. The gate and drain of n-channel transistor 24 are connected to a node 26, and node 26 is further connected to the drain of a p-channel transistor 28, which has its source connected to $V_{DD}$ and its gate connected to ground. Node 26 is further connected to the gate of a p-channel transistor 30, which has its source connected to $V_{DD}$ and its drain connected to a node 32. Node 32 is also connected to the drain of n-channel transistor 22, to the source of an n-channel transistor 34, and to a first terminal of a resistor 36. The second terminal of resistor 36 is connected to ground. The source of n-channel transistor 34 is connected to ground, and the drain of n-channel transistor 34 is connected to a node 38. Node 38 is connected to a first end $E_1$ of a fuse 40, and a second end $E_2$ of fuse 40 is connected to a node 42. Fuse 40 may be constructed using various techniques and of various materials. In the preferred embodiment, fuse 40 has an hour-glass shape with a square polysilicide neck formed by multiple rectangular contacts, and with metal 1 and metal 2 contacts at its ends. Node 42 is connected to a voltage indicated as $V_{PP}^*$, because as discussed in detail later the preferred embodiment also includes an isolation circuit such that during the programming mode $V_{PP}^*=V_{PP}$, whereas during the read mode $V_{PP}^*=V_{DD}$. Node 42 is also connected to the back gate of a p-channel transistor 44. P-channel transistor 44 is part of a CMOS transmission gate which includes an n-channel transistor 46. Thus, the source/drain paths of transistors 44 and 46 are connected in parallel, with an input to this transmission gate connected to node 38 and an output of this transmission gate connected to a node 48, where node 48 provides the read data signal RD. Completing the connections with respect to this transmission gate, the gate of n-channel transistor 46 is connected to receive a word line read signal WLR, and the gate of p-channel transistor 44 is connected to receive a complementary word line read signal WLRB. Completing FIG. 3, node 38 is also connected to the drain of an n-channel transistor 50, which has its source connected to ground and its gate connected to the word line read signal WLR.

The operation of cell C(r,c) of FIG. 3 generally occurs in the two different modes introduced above, namely, a programmation mode and a read mode. Looking in general to FIG. 3, during the programmation mode, the circuitry shown in the schematic to the left of and below fuse 40 operates to provide a data state to fuse 40, thereby programming cell C(r,c) to a data state. Thereafter, during the data read mode, the circuitry shown in the schematic to the right of fuse 40 operates to read the previously-programmed data state. The specific signals and circuitry operation in each of these two modes is discussed below.

The programmation mode of cell C(r,c) is now described. During this mode, $V_{PP}$ as shown in FIG. 1 is provided to controller 12 at a voltage that is independent of $V_{DD}$ and, in some instances, which may be greater than $V_{DD}$; as detailed later, in the case where $V_{PP}>V_{DD}$, an isolation circuit provides the value of $V_{PP}$ to the voltage $V_{PP}^*$ indicated in FIG. 3. Accordingly, during the programmation mode, the independent (and possibly higher) $V_{PP}$ voltage is applied to node 42 and hence to end $E_2$ of fuse 40. Also during the programmation mode, WLPR is asserted high, in response at least in part to the assertion of the PROG signal discussed earlier with respect to FIG. 1, to program an entire word line (i.e., row) of cells in fuse array 14. In other words, in one preferred embodiment, when the PROG signal is asserted, then WLPR is asserted for the appropriate row of cells in array 14. However, in an alternative preferred embodiment, WLPR is asserted only if two conditions are met, namely, one being the assertion of the PROG signal, and another being the receipt of a valid multiple-bit key code word. In this alternative embodiment, therefore, adequate provisions are made for receiving a key word in integrated circuit IC, such as in some type of key code storage device; thus, given a value in the key code storage device, it is examined to determine if it is an accurate key code and, if so, only then will the assertion of the PROG signal cause a corresponding assertion of the WLPR signal. Thus, to the contrary, if the key code is not accurate, then the WLPR signal is not enabled even if the PROG signal is asserted. Note, therefore, the key code provides additional protection against unintentional programming of any one or more fuses in array 14, which could otherwise occur due to an unintentional or unplanned assertion of the PROG signal. Also in this alternative embodiment, the multiple-bit key code word is 32 bits in length, thereby significantly reducing the chance that the device will inadvertently boot up with a number that is accepted as a correct key code. In any event, assuming that the correct key code is stored and that PROG is also asserted, then an asserted high signal for WLPR is connected to input $20_2$ of NAND gate 20. Further, the write data WD bit is also connected to input $20_1$ of NAND gate 20 for each cell to be programmed on the enabled row (i.e., excluding any data that is masked by WREN[34:0]). Assuming therefore that the write data WD is asserted high, then the output of NAND gate 20 transitions low. Note that prior to this time, the output of NAND gate 20 is high, thereby providing a high voltage at the source of n-channel transistor 24 and to the gate of n-channel transistor 22, thereby causing node 32 and the gate of n-channel transistor 34 to be connected to ground. However, once programmation is commenced, the transitioning low output of NAND gate 20 is connected to what is generally an inverter consisting of n-channel transistor 22 and p-channel transistor 30. More particularly, the transitioning low is connected to the gate of n-channel transistor 22, which therefore over time disables that transistor. However, looking at p-channel transistor 28 and n-channel transistor 24, note now that they are generally sized smaller than p-channel transistor 30 and n-channel transistor 22, respectively. Accordingly, with a high signal at the output of AND gate 20, then the diode connection (i.e., gate-to-drain) formed by n-channel transistor 24 becomes forward biased, with a voltage of one threshold voltage greater than the low at the output of AND gate 20 connected to the gate of p-channel transistor 30. Consequently, so long as $V_{DD}$, at the source of p-channel transistor 30, is more than one threshold voltage greater than the gate voltage of p-channel transistor 30, then p-channel transistor 30 begins to conduct $V_{DD}$ at its source to its drain and thereby effectively begins to invert the low signal at its gate, thereby providing a rising output at node 32. The rising signal at node 32 is connected to the gate of n-channel transistor 34, but note that it also is connected through resistor 36 to ground. Thus, there is a delay in time before the voltage at node 32 is sufficient to enable n-channel transistor 34. Returning to the rising signal at the gate of n-channel transistor 34, note that n-channel transistor 34, as connected to fuse 40, may be considered comparable in this respect to what is sometimes referred to as a "zap" transistor in the fuse art, meaning it is enabled to zap, or destroy, the associated fuse, and note also in an alternative embodiment the zap transistor may be a p-channel transistor transistor. Continuing in the present example, therefore, once the signal at its gate is sufficiently large to enable n-channel transistor 34, and note that the transistor is preferably is constructed to be much larger than the other n-channel transistors in FIG. 3, then current is drawn through fuse 40, and note that such current is sourced from $V_{PP}$, which in one embodiment is higher than $V_{DD}$, and in either event therefore at this time $V_{PP}^* = V_{PP}$. In the case where $V_{PP} > V_{DD}$, note therefore that only a portion of cell C(r,c) is stressed by the higher $V_{PP}$ voltage, whereas many of the remaining devices are still powered by the lesser voltage, $V_{DD}$. In any event, if the programmation is successful, then this current through fuse 40 causes fuse 40 to be destroyed, that is, the conductive path through the device is destroyed, thereby leaving an open circuit. As discussed later, in some instances, despite enabling n-channel transistor 34 in the manner just described, the conductive path through fuse 40 might remain partially intact; the preferred embodiment includes additional circuitry in connection with the above-introduced MARGIN[1:0] signal to detect and compensate for such a contingency. Lastly, note of course that the preceding describes the programming of fuse 40 for a first desired output state, whereas if it is desired to provide a second desired output state that is complementary to this first desired output state, then the write data WD is asserted low (which also occurs when WREN disables data to the cell). In such a case, the output of NAND gate 20 is high, thereby enabling n-channel transistor 22 and connecting node 32 to ground. As such, n-channel transistor 34 is not enabled and, hence, current does not pass through fuse 40 and fuse 40 is left intact. Consequently, the second desired output state will be presented by cell C(r,c).

Figure 4:
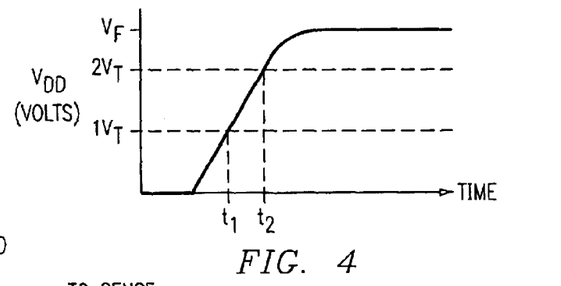
FIG. 4 illustrates a plot of the $V_{DD}$ signal as may be anticipated at power-up.

Before discussing the data read mode of cell C(r,c), an additional discussion of a protective aspect introduced by n-channel transistor 24, p-channel transistor 28, and resistor 36 is further explored in connection with FIG. 4, where in FIG. 4 the horizontal axis plots time and the vertical axis plots the voltage provided as the $V_{DD}$ signal, as may be anticipated at power-up. Note also that such a power-up can be expected under normal operations as well as following an unanticipated shut-down of the device followed by an immediate subsequent power-up. During power-up, it is anticipated that $V_{DD}$ will be applied to integrated circuit IC, and the programmation mode may be sought at the same time, as indicated by the assertion of PROG. However, the present inventors have recognized that during the initial assertion of these signals, PROG may not be immediately stable and $V_{DD}$ also may rise from zero volts toward its intended final voltage, shown in FIG. 4 as $V_F$ (e.g., 1.5 volts). Thus, to prevent any inadvertent destruction of one or more fuses during this time due to these instabilities, the combination of n-channel transistor 24, p-channel transistor 28, and resistor 36, effectively stalls, or delays, the enabling of the programmation mode until $V_{DD}$ reaches a threshold, where in the preferred embodiment the threshold is set at two threshold voltages of the n-channel transistors used in cell C(r,c). Thus, if PROG and $V_{DD}$ are rising at the same level toward logical high values, then at time $t_1$, both signals will reach one threshold voltage ($1V_T$) of the n-channel transistors used in cell C(r,c). This value of $1V_T$ could be sufficient to enable circuitry in a cell and, thus, without additional protection there could be the chance of an inadvertent programming of the fuse at that time. However, the combined devices as mentioned above are such that as of time $t_1$, the output of AND gate 20 do not enable the zap n-channel transistor 34, because at that time $V_{DD}$ has only reached $1V_T$. Continuing in time in FIG. 4, however, by time $t_2$ $V_{DD}$ reaches a voltage of two threshold voltages ($2V_T$). At this point, p-channel transistor 30 is enabled, thereby providing an enabling voltage to the gate of n-channel transistor 34. Accordingly, following time $t_2$, programming of the cell(s) to which WLPR is connected and asserted may occur so long as PROG remains asserted (and the key code is accurate, if implemented) and $V_{DD}$ remains at or above $2V_T$. Note therefore that any instability in the PROG signal before $t_2$ will not cause the cell fuse to become unintentionally programmed. Finally, while the above-described delay is implemented in the preferred embodiment using a voltage threshold mechanism and by setting the condition point at $2V_T$, one skilled in the art may ascertain other delay mechanisms in alternative embodiments.

The data read mode of cell C(r,c) is now described. During this mode, $V_{PP}$ as shown in FIG. 1 is provided to controller 12 at a voltage equal to $V_{DD}$ and, as detailed later, this causes an isolation circuit to provide this reduced value of $V_{DD}$ to the voltage $V_{PP}^*$ indicated in FIG. 3; thus, for purposes of read operation, the only supply voltage is equal to $V_{DD}$. Also during this mode, the word line read WLR and its complement WLRB are asserted, thereby asserting WLR active high and WLRB active low. These two signals enable n-channel transistor 46 and p-channel transistor 44, respectively. As a result, the voltage at node 38 is connected through the transmission gate formed by those two transistors to node 48, thereby providing to the read data signal RD the data state at node 38. That data state, therefore, is connected to a single sense amplifier in the sense amplifiers $16_1$, as described earlier. Given the preceding, note that if fuse 40 has been destroyed through programming, then the voltage $V_{DD}$ at node 38 is connected through transmission gate 48 to provide the signal RD, where note that such voltage is pulled to ground by n-channel transistor 50, which is enabled by WLR, thereby providing a first data state for cell C(r,c); typically, this data state corresponding to a destroyed, or "programmed" fuse is associated with a logical 1. Conversely, if fuse 40 has not been destroyed through programming, then the voltage $V_{PP}^*=V_{DD}$ at node 42 is divided across the series resistance provided by fuse 40 and the source/drain path of n-channel transistor 50. In other words, because WLR is asserted high during the read mode, n-channel transistor 50 is enabled and, thus, the transistor's source/drain resistance, connected to ground, is in series with the resistance of fuse 40 when fuse 40 has not been destroyed through programming. Accordingly, a voltage divider through the resistance of fuse 40 and the source/drain path of n-channel transistor 50 is created from node 42 and tapped at node 38, and that tapped voltage is connected through transmission gate 48 to provide the signal RD, thereby providing a second data state for cell C(rc); typically, this second data state corresponding to an intact, or "unprogrammed" fuse is associated with a logical 0.

Figure 5:
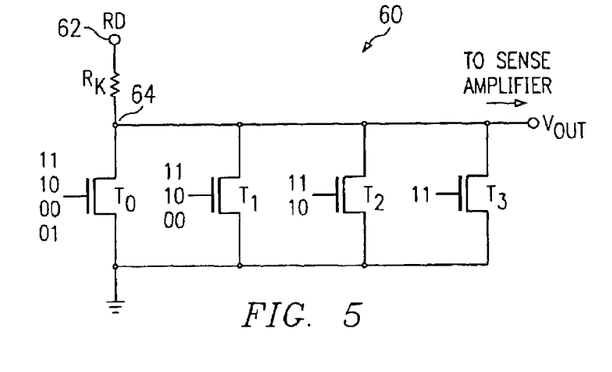
FIG. 5 illustrates a circuit 60 to demonstrate functionally the operation of the MARGIN[1:0] signal in connection with fuse array 14.

FIG. 5 illustrates a circuit 60 to demonstrate functionally the operation of the MARGIN[1:0] signal in connection with fuse array 14, where recall that the MARGIN[1:0] signal is introduced above and it allows for the selection of four different levels of voltage (or corresponding resistance) for testing each programmed fuse. In circuit 60, the read data RD from a cell being tested is connected as one input to a sense amplifier, and the output of circuit 60, $v_{out}$, is connected to the other input of a sense amplifier. Further, the read data RD is also connected to a node 62, and resistor $R_K$, with a known resistance value, is connected between node 62 and a node 64. Between node 64 and ground are connected the source/drain paths of four n-channel transistors $T_0$, $T_1$, $T_2$ and $T_3$. In the preferred embodiment, each of transistors $T_0$, $T_1$, $T_2$ and $T_3$ is constructed to have a different on-resistance, such as by altering the dimensions of the width and/or length of each device. Node 64 also provides an output for circuit 60.

The operation of circuit 60 is now described. First, the 2-bit MARGIN[1:0] signal is decoded into one of four values, based on its two bits, by decoding circuitry that may be readily constructed by one skilled in the art. The two bits may take one of four binary values 00, 01, 10, and 11. For sake of reference, these values are shown in connection with the gates of $T_0$, $T_1$, $T_2$, and $T_3$, with the intention to designate that the decoded value of MARGIN[1:0] is used to assert a high signal at the gate(s) of the transistor receiving the corresponding value. In other words, if MARGIN[1:0]=00, then it is decoded so that an active high signal is asserted to the gate of two of the four n-channel transistors, namely, $T_0$ and $T_1$, whereas if MARGIN[1:0]=01, then it is decoded so that an active high signal is asserted to the gate of n-channel transistor $T_0$, if MARGIN[1:0]=10, then it is decoded so that an active high signal is asserted to the gate of n-channel transistors $T_0$, $T_1$ and $T_2$, and if MARGIN[1:0]=11, then it is decoded so that an active high signal is asserted to the gate of all four n-channel transistors To through $T_3$. Accordingly, for a single value of MARGIN[1:0], different combinations of the four n-channel transistors $T_0$, $T_1$, $T_2$ and $T_3$ are enabled. As a result, the resistance of the source/drain path of the enabled transistor(s) is connected from ground and in series with resistor $R_K$ to the read data signal RD. Given that each of n-channel transistors $T_0$, $T_1$, $T_2$ and $T_3$ has a different on-series resistance and that one of four different combinations of the four transistors is enabled at a time, then a voltage divider is created as between the known resistance $R_K$ and the enabled one(s) of the four n-channel transistors. Further, the voltage RD is dropped across the voltage divider and, therefore, by sampling $v_{out}$ at node 64 (with the column sense amplifier), then the sampled voltage should be within a certain tolerance of an expected voltage. Further, since RD depends on the state of fuse 40 as shown in FIG. 3, then the expected values of RD and $v_{out}$ will depend on whether the fuse is supposed to be intact or has been destroyed through programming. Accordingly, given the functionality of circuit 60, then the output state of the sense amplifier can be sampled to determine whether the actual resistance of fuse 40 is sufficiently close to that which is expected. These aspects are further explored in connection with FIG. 6, below.

To further illustrate the operation of circuit 60 and the results it provides, FIG. 6 illustrates a plot of four resistances that correspond to the output voltage $v_{out}$ from FIG. 5 and corresponding to the respective enabling of each of the combinations of n-channel transistors $T_0$, $T_1$, $T_2$, and $T_3$. More particularly with respect to circuit 60, the preferred embodiment is operable to evaluate the data output provided by each fuse in comparison to the four values of $v_{out}$ provided by altering the state of MARGIN[1:0] to each of its four binary states, where each of the four values of $v_{out}$ corresponds to a different resistance as provided by $R_K$ in series with one of the four enabled combinations of n-channel transistors $T_0$, $T_1$, $T_2$, and $T_3$. Accordingly, each such comparison provides an indication of the resistance provided by the fuse that is at that time providing the sampled data. These aspects will be further appreciated by one skilled in the art given the discussion of each of the four states of MARGIN[1:0], as discussed below.

Looking to the plot of FIG. 6, a value of MARGIN[1:0]= 01 corresponds to a first trip point $TR_1$ with an output voltage $v_{out}$ that corresponds to a resistance $R_1$. In the preferred embodiment, the on-resistance of the enabled transistor $T_0$ is established (and knowing that it is in series with resistor $R_K$) so that this voltage occurs if the resistance of fuse 40 is $R_1$=0.5 kΩ. In other words, if fuse 40 has a resistance below 0.5 kΩ, then $v_{out}$ will provide a digital value of 0, thereby indicating that the tested fuse has a resistance below trip point $TR_1$; alternatively, if fuse 40 has a resistance above 0.5 kΩ, then $v_{out}$ will provide a digital value of 1, thereby indicating that the tested fuse has a resistance above trip point $TR_1$. This trip point, therefore, permits the comparing of the resistance of fuse 40 with a resistance of 0.5 kΩ, where the result of that comparison is essentially represented by the output state of the sense amplifier. For example, once integrated circuit IC is manufactured to include fuse array 14 and before any fuses therein have been programmed, it is anticipated that the resistance of each such fuse will be on the order of 50Ω. Accordingly, by setting MARGIN[1:0]=01, then each fuse may be addressed and the voltage it provides may be compared by the sense amplifier to provide a resistance determination relative to trip point $TR_1$. As a result, and as also implemented in the preferred embodiment, various control (e.g., firmware or state logic) is provided in controller 12 and using this control it preferably operates to test all fuses prior to programmation to ensure that they are intact and provide a satisfactory resistance in the intact state. Such testing is performed by controller 12 setting MARGIN[1:0]=01 and testing each fuse in array 14 to ensure that its resistance corresponds to, or is less than, that represented by trip point $TR_1$. Specifically, for each fuse in the unblown state, it is anticipated that the resistance it provides will be far below trip point $TR_1$ and, thus, it is anticipated that the sense amplifier will output a digital value of 0. Thus, if all unblown fuses are addressed (row by row) and the testing data provides all digital values equal to 0, then each fuse can be presumed to have an appropriate resistance for an unblown fuse. However, if an unblown fuse corresponds to a digital test value of 1 when MARGIN[1:0]=01, then additional measures are required. For example, if only a single fuse provides such data, or if multiple fuses along the same row provide such data, then the redundancy aspects described above may be implemented whereby the address of the row containing the problematic fuse(s) is re-directed to a different row by the redundancy addressing information in row 0 of fuse array 14. However, if unblown fuses on multiple rows provide data indicating improper resistance, then it may be appropriate to discard the entire integrated circuit IC. Note further that this testing also provides margin testing for sake of operation. More particularly, given the preceding, note that the circuit may be tested at one time using one set of operating environment conditions (e.g., temperature, voltage, process variations) and provided a satisfactory level of margin is found for each fuse, then it may be accepted that the circuit also will operate properly under different operating conditions.

Continuing with the plot of FIG. 6, a value of MARGIN [1:0]=00 enables transistors $T_0$ and $T_1$, and corresponds to a trip point $TR_2$ and an output voltage $v_{out}$ that corresponds to a resistance $R_2$ (knowing that the two enabled transistors are in parallel with one another, and that parallel resistance is in series with resistor $R_K$). In the preferred embodiment, the on-resistance of the parallel transistors $T_0$ and $T_1$ is established so that $R_2$=1.0 kΩ. The value of 1.0 kΩ is chosen as a nominal value, that is, the intended sampling reference when each fuse is read during normal operations; in other words, as each cell is typically read, it is anticipated that its fuse resistance will be evaluated with respect to $R_2$ and, thus, for a resulting digital output of 0, the fuse will be read to be unblown, while for a resulting digital output of 1, the fuse will be read to be blown. While this represents a nominal value, however, ideally each fuse, depending on whether it is blown, will have a resistance that is sufficiently distant from $R_2$, which therefore provides greater assurance of proper operation under different operating environments. Further in this regard, therefore, when margin testing at trip point $TR_2$ which provides $R_2$=1.0 kΩ., then the resistance of unblown fuses can be measured, and given the above-stated expectation that such fuses provide a resistance on the order of 50 Ω, then each such fuse should provide a digital value of 0, while at the same time the resistance of each blown (i.e., programmed) fuse can be measured relative to trip point $TR_2$, where in the preferred embodiment it is expected such fuses provide a resistance on the order of 1 MΩ and, thus, testing of such fuses should provide a digital value of 1. Thus, after programming, by setting MARGIN[1:0]=00, then each fuse may be addressed and the voltage it provides may be compared by the sense amplifier to trip point $TR_2$, again such as by using control in controller 12 to perform this analysis. Thus, these digital values can be examined, once more to determine whether the fuses all provide accurate data, or whether a row includes one or more fuses providing unreliable data, in which case corrective action may be taken.

Continuing with the plot of FIG. 6, a value of MARGIN [1:0]=10 enables transistors $T_0$, $T_1$, and $T_2$ and corresponds to a trip point $TR_3$ and an output voltage $v_{out}$ that corresponds to a resistance $R_3$. In the preferred embodiment, the on-resistance of the parallel transistors $T_0$, $T_1$, and $T_2$ are established so that $R_3$=5.0 kΩ. This additional trip point is implemented in the preferred embodiment to provide an additional resolution in examining the outcome for blown fuses. Specifically, for the above-discussed trip point $TR_2$, a blown fuse may provide a digital value of 1, thereby indicating a resistance higher than 1.0 kΩ. However, upon further testing and specifically by setting a value of MARGIN[1:0]=10 to enable trip point $TR_3$, that same fuse may then provide a digital value of 0, thereby suggesting that the fuse resistance, while greater than 1.0 kΩ is less than 5.0 kΩ. Accordingly, such a fuse, while not having the 1 MΩ resistance expected of a blown fuse, may still provide sufficient resistance to provide accurate data. However, at the same time, this test thereby indicates a potential need to further scrutinize the manufacturing process of integrated circuit IC so as to increase the resistance of such blown fuses. In other words, this additional test may provide additional information to facilitate improvements in the manufacturing process.

Completing the plot of FIG. 6, a value of MARGIN[1:0]= 11 enables all four transistors $T_0$ through $T_3$ and corresponds to a trip point $TR_4$ and an output voltage $v_{out}$ that corresponds to a resistance $R_4$. In the preferred embodiment, the on-resistance of the parallel transistors $T_0$ through $T_3$ is established so that $R_4$=30.0 kΩ. This additional trip point, like trip point $TR_3$, also provides additional resolution in examining the outcome for blown fuses. For example, in the case of the above-discussed trip point $TR_3$, a blown fuse may provide a digital value of 1, thereby indicating a resistance higher than 5.0 kΩ, but upon further testing where MARGIN [1:0]=11, that same fuse may then provide a digital value of 0, thereby suggesting that the fuse resistance, while greater than 5.0 kΩ is less than 30.0 kΩ. Once more, therefore, such a fuse does not have the 1 MΩ resistance expected of a blown fuse and may still provide sufficient resistance to provide accurate data, yet this test also can indicate a potential need to further scrutinize the manufacturing process of integrated circuit IC so as to increase the resistance of such blown fuses.

Having described circuit 60 of FIG. 5 and its operation in connection with the preferred embodiments as illustrated in FIG. 6, note also that margin testing has heretofore been implemented by Texas Instruments Incorporated in a distributed-fuse architecture. However, in the previous implementation, margin testing was only provided for a nominal read, that is, comparable to trip point $TR_2$, as well as a margin test for a blown fuse comparable to trip point $TR_3$. In contrast, therefore, in this prior implementation, no margin setting comparable to trip point $TR_1$, to test all unblown fuses, was provided. Additionally, only one higher resistance margin was provided, thereby permitting a limited amount of resolution in examining the resistance for blown fuses. In contrast, the preferred embodiments provide both a low side trip point $TR_1$ for examining all fuses before programmation (i.e., with the expectation that those fuses are all unblown) as well as an additional high side trip point for providing further guidance of the results achieved by the manufacturing and fuse-blowing processes.

Figure 7:
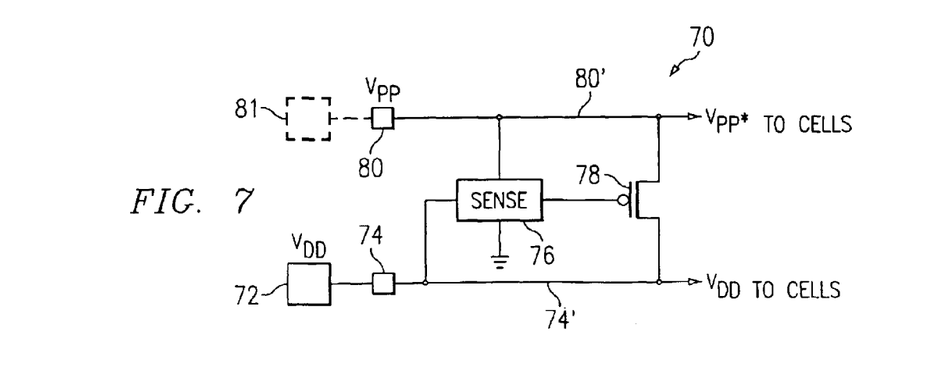
FIG. 7 illustrates a voltage isolation circuit 70 for selectively isolating the programming voltage $V_{PP}$ from the voltage $V_{DD}$.

FIG. 7 illustrates a voltage isolation circuit 70 introduced earlier with respect to the programmation and read modes described relative to FIG. 3. By way of introduction, note that circuit 70 is preferably included within integrated circuit IC of FIG. 1, although not expressly shown in that earlier Figure, and indeed circuit 70 may be included in controller 12 to provide $V_{PP}$* and $V_{DD}$. Looking first to the devices and connections of circuit 70, the voltage $V_{DD}$ is connected to an external bond pad 72, such as is preferably located on the periphery of the package into which integrated circuit IC is formed. Bond pad 72 is connected to an internal contact pad 74, where contact pad 74 thereby corresponds to a node 74' that is connected as a first input to a differential sense circuit 76 and to the drain of a p-channel transistor 78. The voltage at node 74' provides $V_{DD}$ to the cells C(r,c) in fuse array 14. Circuit 70 also includes a contact pad 80 connected to receive the programming voltage $V_{PP}$. In one preferred embodiment, $V_{PP}$ is only provided to integrated circuit IC by way of contact pad 80 during the manufacturing process, when access is available to contact pad 80, but no such physical access is contemplated to such pad once integrated circuit IC is later packaged; thus, no external bond pad is provided for $V_{PP}$. In an alternative embodiment, however, contact pad 80 is connected to an at least one external bond pad 81, and because such a connection is an optional an alternative approach, pad 81 and the connection to it in FIG. 7 are shown with dotted lines. Note also that in lieu of a single external bond pad 81, a small number of external bond pads such as on the order of two pads may used, preferably in close proximity to fuse array 14, where any pad beyond one provides benefits such as redundancy and reduced probe resistance and inductance when programmation is achieved during the probe testing process. In any event, bond pad 81 is implemented where it is desired to be able to provide programmation once integrated circuit IC is packaged. However, even in this latter case, only one or a few such pads are preferable and located immediately proximate programmable fuse block 10. Note that such a result is in contrast to the prior art distributed fuse approach wherein numerous programming voltage bond pads are located around the perimeter of the package so that different groups of prior art fuses can be programmed from programming voltage applied to a voltage bond pad close to each such group. In any event, contact pad 80 thereby corresponds to a node 80' that is connected as a second input to differential sense circuit 76 and to the source of a p-channel transistor 78. Lastly, the output of differential sense circuit 76 is connected to the gate of p-channel transistor 78.

Turning to the operation of isolation circuit 70, by way of introduction recall that $V_{PP}$ in one embodiment is preferably greater than $V_{DD}$ in order to provide sufficient drive power to destroy those fuses desired to be blown during programmation. By way of example in a contemporary implementation, $V_{PP}$ may be on the order of 3.0 volts, while $V_{DD}$ may be on the order of 1.5 volts. Thus, in the programmation mode, assume that $V_{PP}$=3.0 volts and $V_{DD}$=1.5 volts, as provided to contacts 80 and 74, respectively. These two voltages are input to differential sense circuit 76, and in response to detecting a difference of 1.5 volts at its two inputs, differential sense circuit 76 outputs a disabling high signal to p-channel transistor 78. As a result, p-channel transistor 78 is disabled and, thus operates as an open switch; consequently, node 74' is isolated from node 80'. Accordingly, during the programmation mode, node 80' provides the voltage $V_{PP}^*=V_{PP}$ and node 74' provides the voltage $V_{DD}$ to each desired cell C(r,c). Conversely, recall that during the read mode, $V_{PP}$ is left to float, such as would occur once integrated circuit IC is packaged if access to contact pad 80 is no longer provided in the embodiment where it has no corresponding external bond pad. Thus, differential sense circuit 76 receives the voltage $V_{DD}$ from node 74' and also the floating voltage of $V_{PP}$ from node 80'. In response, differential sense circuit 76 outputs an enabling low signal to the gate of p-channel transistor 78. Accordingly, during the read mode, the enabled p-channel transistor 78 operates as a closed switch and thereby electrically connects nodes 74' and 80' together; as a result, both nodes 74' and 80' of circuit 70 provide the voltage $V_{PP}^*=V_{DD}$ to each desired cell C(r,c).

Given the construction and operation of isolation circuit 70, various benefits will be ascertainable by one skilled in the art. For example, by isolating the higher $V_{PP}$ voltage from devices connected to $V_{DD}$, there is the reduction of the chance of damaging the isolated devices which might otherwise occur if they were exposed to the relatively higher voltage of $V_{PP}$. Further, in the current context where electrical fuses are involved, there is the reduction of a chance of unintentionally destroying one or more of such fuses, and thereby changing their data states by isolating $V_{PP}$ from the fuses, after programmation is complete. As another benefit, while some prior art fuse circuits implement a resistor between $V_{PP}$ and $V_{DD}$ in an effort to maintain a voltage difference between the two, the preferred embodiment implements a complete isolation as between the two through the use of a disabling device, which is illustrated as a p-channel transistor. The complete isolation provides benefits over the resistor in that the latter still permits some power sharing as between the connections for $V_{PP}$ and $V_{DD}$.

From the above, it may be appreciated that the above embodiments provide numerous advantages over prior art programmable fuse circuits, such as those in which each or the majority of fuses are distributed to various different locations across an integrated circuit die. For example, the electrically programmable fuses in the preferred embodiments are arranged in a more compact configuration, providing numerous advantageous such as design efficiency, reduced power signal routing due to being organized in a compact location, and scalability to other devices and for other numbers of fuses. As another benefit, by using electrically programmable fuses, note that no additional process steps are required, that is, no additional masking step or the like is required to program individual cells. Instead, selective electrically programmable fuses may be programmed by application of current to those fuses. Indeed, in one preferred approach, programmation can be achieved during probe testing, thereby combining the programming and testing functions and, thus, without altering the manufacturing flow. As another benefit, the preferred embodiment includes at least one row of redundancy, thereby providing improved yield in the event one or more fuses does not provide a proper resistance after it is programmed or that a fuse otherwise is not operable to provide valid data. As another example, instantaneous power consumption during the read mode is much lower than with the chain fuse architecture for various reasons, including that each cell in the preferred embodiment does not require its own sense amplifier and all cells need not be read at once. As still another example, groups of cells are subject to various collective treatment, such as read protection, write protection, and parity checking. As still another example, multiple margin sense points are provided to improve reliability and manufacturing testability. Many additional benefits have been detailed above, and still others will be ascertainable by one skilled in the art. From the preceding, therefore, it may be appreciated that the preferred embodiments may include numerous aspects, and these aspects both singularly and in combination provide numerous benefits over the prior art. As still another benefit, note that while the present embodiments have been described in detail, various substitutions, modifications or alterations could be made to the descriptions set forth above without departing from the inventive scope which is defined by the following claims.

What is claimed is:

1. An integrated circuit, comprising:
    an array of data cells arranged in a plurality of rows and a plurality of columns;
        wherein each of the data cells comprises an electrically programmable fuse;

wherein the electrically programmable fuse comprises a current path for providing a first digital state when the current path is left intact and for providing a second digital state when the current path is destroyed; and wherein each row of the plurality of rows comprises at least one cell reserved for providing a protection indicator for the row, wherein the protection indicator is selected from a set consisting of read protection and write protection;

control circuitry for selectively destroying the programmable fuse in selected ones of the data cells in a programmation mode; and control circuitry for reading selected ones of the data cells in a read mode.

2. The integrated circuit of claim 1 and further comprising:

a plurality of storage circuits, wherein each storage circuit of the plurality of storage circuits is coupled to at least one other storage circuit to form a scan chain from the plurality of storage circuits; and output circuitry for scanning data from the data cells read in the read mode into the scan chain formed by the plurality of storage circuits.

3. The integrated circuit of claim 2 wherein the control circuitry for reading selected ones of the data cells in a read mode comprises:

circuitry for receiving a user input signal provided externally relative to the integrated circuit;

circuitry, responsive to receiving the user input signal, for reading data from data cells from a single row of the plurality of rows at a time and for providing the read data to the output circuitry; and circuitry for outputting a user ready signal, externally relative to the integrated circuit, upon completing the read of the data from data cells in selected rows of the array and outputting the read data into the scan chain.

4. The integrated circuit of claim 2 wherein the control circuitry for selectively destroying comprises:

circuitry for addressing a single row of the plurality of rows at a time; and circuitry for applying a first value to data cells arranged in a first set of columns in the single row and for applying a second value to data cells arranged in a second set of columns in the single row, wherein in response the programmable fuse in each of the data cells arranged in the first set of columns is destroyed and in response the programmable fuse in each of the data cells arranged in the second set of columns is left intact.

5. The integrated circuit of claim 2 wherein the output circuitry comprises a plurality of sense amplifiers, wherein each sense amplifier in the plurality of sense amplifiers corresponds to a respective one of the plurality of columns.

6. The integrated circuit of claim 1:

wherein the data cells consist of a number of data cells;

wherein the control circuitry for reading comprises a number of sense amplifiers;

wherein each sense amplifier is operable to sense data from a corresponding one of the data cells; and wherein the number of sense amplifiers is less than the number of data cells.

7. The integrated circuit of claim 1 wherein one of the plurality of rows comprises a row of data cells for storing control data.

8. The integrated circuit of claim 7 wherein the control data comprises a read protection bit, and further comprising circuitry for preventing data in the data cells from being read externally with respect to the integrated circuit in response to a set state of the read protection bit.

9. The integrated circuit of claim 7 wherein the control data comprises a write protection bit, and further comprising circuitry for preventing data in the data cells from being written in response to a set state of the write protection bit.

10. The integrated circuit of claim 7 wherein the control data comprises a row redundancy indicator, wherein the control circuitry for reading comprises circuitry for addressing a redundant row in the array of data cells in response to a set state of the redundancy indicator.

11. The integrated circuit of claim 10:

wherein the redundancy indicator comprises an address of a specified row in the array of data cells; and wherein the specified row comprises at least one defective data cell.

12. The integrated circuit of claim 11 wherein the redundancy indicator further comprises a redundancy enable bit.

13. The integrated circuit of claim 7 wherein the control data comprises a compression algorithm indicator.

14. The integrated circuit of claim 7 and further comprising an internal oscillator for providing a clock signal, wherein the control data comprises a clock speed indicator for the clock signal.

15. The integrated circuit of claim 1 wherein each of the plurality of rows comprises a respective data cell for storing a read protection indicator, and further comprising circuitry for preventing data in the respective row from being read in response to a set state of the read protection bit.

16. The integrated circuit of claim 1 wherein each of the plurality of rows comprises a respective data cell for storing a write protection indicator, and further comprising circuitry for preventing data in the respective row from being written in response to a set state of the write protection bit.

17. The integrated circuit of claim 1 wherein each of the plurality of rows comprises a respective data cell for storing a parity indicator corresponding to parity of data stored in the respective row.

18. The integrated circuit of claim 1:

wherein each data cell is coupled to receive a supply voltage;

wherein the control circuitry for selectively destroying selected ones of the data cells in the programmation mode is placed in the programmation mode in response to a program signal; and wherein each data cell comprises circuitry for delaying the programmation mode, following an assertion of the program signal, until the supply voltage has received a threshold.

19. The integrated circuit of claim 18 wherein the circuitry for delaying comprises:

a first node for presenting an asserted state for causing programming of the programmable fuse in the data cell that includes the first node;

a first n-channel transistor having a source connected to the first node and a gate and a drain connected to a second node;

a first p-channel transistor having a source connected to receive the supply voltage, a gate connected to receive a reference voltage that is less than the supply voltage, and a drain connected to the drain of the first n-channel transistor;

a second n-channel transistor having a gate connected to the first node and a source connected to receive the reference voltage; and a second p-channel transistor having a source connected to receive the supply voltage, a drain connected to a drain of the second n-channel transistor, and a gate connected to the drain of the first p-channel transistor.

20. The integrated circuit of claim 19 wherein each data cell further comprises a third n-channel transistor having a gate connected to the drain of the second n-channel transistor and to the drain of the second p-channel transistor, the third n-channel transistor connected to cause current to flow through the programmable fuse for the corresponding data cell during the programming mode and in response to the asserted state at the first node.

21. The integrated circuit of claim 18 and further comprising:
   circuitry for storing a multiple bit key word; and
   circuitry for determining whether a multiple bit key word, stored in the circuitry for storing, matches a valid key word; and
   wherein the control circuitry for selectively destroying selected ones of the data cells in the programmation mode is placed in the programmation mode in response to both the program signal and a determination by the circuitry for determining that the stored multiple bit key word matches the valid key word.

22. The integrated circuit of claim 1:
   wherein each data cell comprises a first node for receiving a program voltage during the programmation mode, the first node for receiving the program voltage coupled to the electrically programmable fuse of the data cell;
   wherein each data cell comprises a second node for receiving a supply voltage during the programmation mode, the second node coupled to a source of at least one p-channel transistor in the data cell; and
   wherein the program voltage is greater than the supply voltage.

23. The integrated circuit of claim 22 wherein each data cell further comprises circuitry for isolating the first node from the second node during the programmation mode and for connecting the first node to the second node during the read mode.

24. The integrated circuit of clam 23 wherein the circuitry for isolating comprises a switch coupled between the first node and the second node.

25. The integrated circuit of clam 24 wherein the switch is selected from a set consisting of an n-channel transistor and a p-channel transistor.

26. The integrated circuit of clam 1 wherein the control circuitry for selectively destroying comprises control circuitry operable to selectively destroy the programmable fuse in data cells selected from a single row in the plurality of rows in a single clock cycle.

27. The integrated circuit of claim 26 wherein the control circuitry for selectively destroying selectively destroys in response to a data input signal comprising a number of bits equal to a number of data cells in the single row.

28. The integrated circuit of claim 27 and further comprising circuitry for masking the data input signal at selected locations in response to a mask input, such that the fuse in each data cell corresponding to an asserted state in the mask input is not destroyed.

29. The integrated circuit of claim 1 and further comprising circuitry for comparing each resistance in a set of predetermined resistances to a resistance of the programmable fuse in a selected data cell.

30. The integrated circuit of claim 29 wherein the set of predetermined resistances comprises at least three different resistances.

31. The integrated circuit of claim 29 and further comprising circuitry for comparing the resistance of the programmable fuse of a selected data cell in the array of cells to a first resistance in the set of predetermined resistances, wherein the first resistance provides a resistance greater than an intended resistance of the programmable fuse in an unblown state.

32. The integrated circuit of claim 29:
   wherein the control circuitry for reading reads selected ones of the data cells in a read mode in comparison to a nominal resistance; and
   further comprising circuitry for comparing the resistance of the programmable fuse of a selected data cell in the array of cells to a first resistance in the set of predetermined resistances, wherein the first resistance is less than the nominal resistance.

33. The integrated circuit of claim 32 and further comprising circuitry for comparing the resistance of the programmable fuse of a selected data cell in the array of cells to a second resistance in the set of predetermined resistances, wherein the second resistance provides a resistance greater than the nominal resistance.

34. The integrated circuit of claim 33 and further comprising circuitry for comparing the resistance of the programmable fuse of a selected data cell in the array of cells to a third resistance in the set of predetermined resistances, wherein the third resistance provides a resistance greater than the second resistance.

35. The integrated circuit of claim 1 and further comprising:
   a plurality of storage circuits, wherein each storage circuit of the plurality of storage circuits is coupled to at least one other storage circuit to form a scan chain from the plurality of storage circuits; and
   output circuitry for scanning data from the data cells read in the read mode into the scan chain formed by the plurality of storage circuits;
   wherein the data stored in the plurality of storage circuits is for providing functionality selected from a group consisting of memory control data, integrated circuit die identification, analog trim control, configuration bits, and encryption key coding.

36. The integrated circuit of claim 1 wherein the electrically programmable fuse comprises an anti-fuse.

37. The integrated circuit of claim 1 wherein each of the plurality of rows further comprises a plurality of error correction bits corresponding to data stored in the respective row.

38. The integrated circuit of claim 1:
   wherein each data cell is coupled to receive a supply voltage; and
   wherein the control circuitry for selectively destroying selected ones of the data cells in the programmation mode is placed in the programmation mode in response to both a program signal and a multiple-bit key word.

39. The integrated circuit of claim 1:
   wherein the array comprises a first array;
   and further comprising a plurality of arrays, wherein the plurality of arrays includes the first array.

40. The integrated circuit of claim 39:
   wherein each array in the plurality of arrays comprises an array of data cells arranged in a plurality of rows and a plurality of columns;
   wherein each of the data cells, in each array in the plurality of arrays, comprises an electrically programmable fuse;

wherein the electrically programmable fuse, in each array in the plurality of arrays, comprises a current path for providing a first digital state when the current path is left intact and for providing a second digital state when the current path is destroyed; and wherein each row of the plurality of rows, in each array in the plurality of arrays, comprises at least one cell reserved for providing a protection indicator for the row, wherein the protection indicator is selected from a set consisting of read protection and write protection.

41. The integrated circuit of claim 40 wherein the plurality of storage circuits forms a first scan chain, and further comprising a plurality of scan chains, wherein the plurality of scan chains include the first scan chain.

42. The integrated circuit of claim 41 and further comprising output circuitry for scanning data from each array in the plurality of arrays at a same time.

43. The integrated circuit of claim 39 wherein the plurality of storage circuits forms a first scan chain, and further comprising a plurality of scan chains, wherein the plurality of scan chains include the first scan chain.

44. The integrated circuit of claim 43 and further comprising output circuitry for scanning data from each array in the plurality of arrays at a same time.

45. An integrated circuit, comprising:
an array of data cells arranged in a plurality of rows and a plurality of columns;
wherein each of the data cells comprises an electrically programmable fuse; and
wherein the electrically programmable fuse comprises a current path for providing a first digital state when the current path is left intact and for providing a second digital state when the current path is destroyed;
control circuitry for selectively destroying the programmable fuse in selected ones of the data cells in a programmation mode; and
control circuitry for reading selected ones of the data cells in a read mode;
wherein one of the plurality of rows comprises a row redundancy indicator; and
wherein the control circuitry for reading comprises circuitry for addressing a redundant row in the array of data cells in response to a set state of the redundancy indicator.

46. The integrated circuit of claim 45 and further comprising:
a plurality of storage circuits, wherein each storage circuit of the plurality of storage circuits is coupled to at least one other storage circuit to form a scan chain from the plurality of storage circuits; and
output circuitry for scanning data from the data cells read in the read mode into the scan chain formed by the plurality of storage circuits.

47. The integrated circuit of claim 45:
wherein the redundancy indicator comprises an address of a specified row in the array of data cells; and
wherein the specified row comprises at least one defective data cell.

48. The integrated circuit of claim 45 wherein an address of the redundant row does not affect an address of each row in the plurality of rows other than the specified row.

49. An integrated circuit, comprising:
an array of data cells arranged in a plurality of rows and a plurality of columns;
wherein each of the data cells comprises an electrically programmable fuse; and
wherein the electrically programmable fuse comprises a current path for providing a first digital state when the current path is left intact and for providing a second digital state when the current path is destroyed;
control circuitry for selectively destroying the programmable fuse in selected ones of the data cells in a programmation mode; and
control circuitry for reading selected ones of the data cells in a read mode;
wherein each data cell comprises a first node for receiving a program voltage during the programmation mode, the first node for receiving the program voltage coupled to the electrically programmable fuse of the data cell;
wherein each data cell comprises a second node for receiving a supply voltage during the programmation mode, the second node coupled to a source of at least one p-channel transistor in the data cell; and
wherein the program voltage is greater than the supply voltage.

50. The integrated circuit of claim 49 and further comprising:
a plurality of storage circuits, wherein each storage circuit of the plurality of storage circuits is coupled to at least one other storage circuit to form a scan chain from the plurality of storage circuits; and
output circuitry for scanning data from the data cells read in the read mode into the scan chain formed by the plurality of storage circuits.

51. The integrated circuit of claim 49 wherein each data cell further comprises circuitry for isolating the first node from the second node during the programmation mode and for connecting the first node to the second node during the read mode.

52. The integrated circuit of clam 51 wherein the circuitry for isolating comprises a switch coupled between the first node and the second node.

53. The integrated circuit of clam 52 wherein the switch is selected from a set consisting of an n-channel transistor and a p-channel transistor.

54. An integrated circuit, comprising:
an array of data cells arranged in a plurality of rows and a plurality of columns;
wherein each of the data cells comprises an electrically programmable fuse;
wherein the electrically programmable fuse comprises a current path for providing a first digital state when the current path is left intact and for providing a second digital state when the current path is destroyed; and
control circuitry for selectively destroying the programmable fuse in selected ones of the data cells in a programmation mode;
control circuitry for reading selected ones of the data cells in a read mode; and
circuitry for comparing each resistance in a set of predetermined resistances to a resistance of the programmable fuse in a selected data cell, wherein the set of predetermined resistances comprises at least three different resistances.

55. The integrated circuit of claim 54 and further comprising circuitry for comparing the resistance of the programmable fuse of a selected data cell in the array of cells to a first resistance in the set of predetermined resistances, wherein the first resistance provides a resistance less than an intended resistance of the programmable fuse in an unblown state.

56. The integrated circuit of claim 54:
   wherein the control circuitry for reading reads selected ones of the data cells in a read mode in comparison to a nominal resistance; and
   further comprising circuitry for comparing the resistance of the programmable fuse of a selected data cell in the array of cells to a first resistance in the set of predetermined resistances, wherein the first resistance is less than the nominal resistance.

57. The integrated circuit of claim 56 and further comprising circuitry for comparing the resistance of the programmable fuse of a selected data cell in the array of cells to a second resistance in the set of predetermined resistances, wherein the second resistance provides a resistance greater than the nominal resistance.

58. The integrated circuit of claim 57 and further comprising circuitry for comparing the resistance of the programmable fuse of a selected data cell in the array of cells to a third resistance in the set of predetermined resistances, wherein the third resistance provides a resistance greater than the second resistance.

59. The integrated circuit of claim 54 and further comprising:
   a plurality of storage circuits, wherein each storage circuit of the plurality of storage circuits is coupled to at least one other storage circuit to form a scan chain from the plurality of storage circuits; and
   output circuitry for scanning data from the data cells read in the read mode into the scan chain formed by the plurality of storage circuits.

60. An integrated circuit, comprising:
   an array of data cells arranged in a plurality of rows and a plurality of columns;
      wherein each of the data cells comprises an electrically programmable fuse;
      wherein the electrically programmable fuse comprises a current path for providing a first digital state when the current path is left intact and for providing a second digital state when the current path is destroyed;
   circuitry for storing a multiple bit key word;
   circuitry for determining whether a stored multiple bit key word matches a valid key word;
   control circuitry for selectively destroying the programmable fuse in selected ones of the data cells in a programmation mode and in response to both a program signal and a determination by the circuitry for determining that the stored multiple bit key word matches the valid key word; and
   control circuitry for reading selected ones of the data cells in a read mode.

61. The integrated circuit of claim 60 and further comprising:
   a plurality of storage circuits, wherein each storage circuit of the plurality of storage circuits is coupled to at least one other storage circuit to form a scan chain from the plurality of storage circuits; and
   output circuitry for scanning data from the data cells read in the read mode into the scan chain formed by the plurality of storage circuits.

* * * * *

UNITED STATES PATENT AND TRADEMARK OFFICE
CERTIFICATE OF CORRECTION

PATENT NO. : 6,876,594 B2
DATED : April 5, 2005
INVENTOR(S) : Roger C. Griesmer et al.

It is certified that error appears in the above-identified patent and that said Letters Patent is hereby corrected as shown below:

<u>Title page,</u>
Item [75], Inventors, should read -- Kun-Hsi Li, Plano, TX (US) --

Signed and Sealed this

Seventh Day of June, 2005

JON W. DUDAS
*Director of the United States Patent and Trademark Office*